United States Patent
Murata et al.

(10) Patent No.: US 6,425,695 B1
(45) Date of Patent: Jul. 30, 2002

(54) OPTICAL MODULE AND METHOD OF MANUFACTURING THE SAME

(75) Inventors: Akihiro Murata, Yamahashi-ken; Shojiro Kitamura, Nagano-ken, both of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/509,898
(22) PCT Filed: Aug. 3, 1999
(86) PCT No.: PCT/JP99/04165
§ 371 (c)(1), (2), (4) Date: Apr. 3, 2000
(87) PCT Pub. No.: WO00/08729
PCT Pub. Date: Feb. 17, 2000

(30) Foreign Application Priority Data
Aug. 5, 1998 (JP) .......................................... 10-233607

(51) Int. Cl.[7] ................................................ G02B 6/36
(52) U.S. Cl. .......................................... 385/88; 385/89
(58) Field of Search ............................ 385/88, 89, 92, 385/94

(56) References Cited

U.S. PATENT DOCUMENTS 5,909,523 A * 6/1999 Sakaino et al. ............... 385/49
6,019,523 A * 2/2000 Honmou ....................... 385/94
6,217,232 B1 * 4/2001 Duesman et al. .............. 385/88

FOREIGN PATENT DOCUMENTS

| JP | 56-149475 | 11/1981 |
| JP | A-63-241939 | 10/1988 |
| JP | A-02-073208 | 3/1990 |
| JP | A-04-349674 | 12/1992 |
| JP | A-09-127375 | 5/1997 |
| JP | A-10-010374 | 2/1998 |
| JP | A-10-039162 | 2/1998 |
| TW | 09082006921 | 12/2001 |

OTHER PUBLICATIONS

Laser Diodes/Hologram Lasers Data Book, Sharp Corporation Japan.
Article, Optical Fiber Characteristics and Applications, Chapters 4 and 9.

* cited by examiner

Primary Examiner—Cassandra Spyrou
Assistant Examiner—Alessandro V. Amari
(74) Attorney, Agent, or Firm—Oliff & Berridge, PLC

(57) ABSTRACT

A surface emission laser (14) is disposed so that a side surface (15) of a semiconductor substrate of the surface emission laser (14) faces a plane (13) of a mounting substrate (12). By this means, emitted light (44) from the surface emission laser (14) travels in the direction along the plane (13) of the mounting substrate (12). Therefore, it is possible to dispose the optical fiber (16) so as to be along the plane (13) of the mounting substrate (12). By this means, an optical module (10) can be made thinner.

22 Claims, 11 Drawing Sheets

OPTICAL MODULE AND METHOD OF MANUFACTURING THE SAME

TECHNICAL FIELD

The present invention relates to an optical module which is formed by integrating an optical element, optical waveguide, or the like, and a method of manufacturing the same.

BACKGROUND OF ART

An optical module is a transducer from electrical energy to light, or from light to electrical energy. An optical module is constituted in hybrid integrated form by an optical element, an optical waveguide, an electronic circuit, and the like. Optical modules are used, for example, in an optic fiber communications system. A conventional optical module is disclosed, for example, in Japanese Patent Application Laid-Open No. 6-237016.

This optical module uses a surface emission laser as the light-emitting element. The surface emission laser is formed on a semiconductor substrate. The light is emitted in the direction perpendicular to the plane of this semiconductor substrate. As a result, when this optical module has the surface emission laser mounted on the mounting substrate, light is emitted in the vertically upward direction. Therefore, the optical fiber must be attached to the mounting substrate so as to face vertically upwards. Therefore, the thickness of the optical module is increased to the extent that the optical fiber extends upwards.

Electronic instruments are required to be thinner. Naturally, therefore, optical modules are also required to be thinner.

The present invention solves this problem. The object of the present invention is the provision of an optical module and method of manufacturing the same, such that the optical module can be made thinner.

DISCLOSURE OF THE INVENTION

The present invention provides an optical module comprising: a mounting member; and an optical element mounted on a plane of the mounting member, the optical element is formed on a semiconductor substrate, emits light in a direction perpendicular to the plane of the semiconductor substrate, and admits light from a direction perpendicular to the plane of the semiconductor substrate; and the optical module further comprises an optical waveguide mounted on the plane of the mounting member and guiding light emitted from the optical element or light admitted to the optical element; the optical element is mounted so that light emitted from the optical element or light admitted to the optical element travels in a direction along the plane of the mounting member; and the optical waveguide is mounted along the plane of the mounting member.

The optical module of the present invention has the optical element mounted so that the light travels in a direction along the plane of the mounting member. Therefore, the optical waveguide can be disposed so as to be along the plane of the mounting member. According to the present invention, the optical module can be made thinner than the conventional optical module in which the optical waveguide is oriented vertically.

In the optical module of the present invention, the optical element may have an optical aperture from which light is emitted or to which light is admitted, and the optical aperture may be oriented along the plane of the mounting member. When the optical element is oriented in this way, the light travels in a direction along the plane of the mounting member.

The optical module of the present invention may have a positioning member for positioning the optical element mounted on the plane of the mounting member. Without the positioning member, the size of the optical element must be designed so that the optical element and optical waveguide are positioned properly when the optical element is connected with the optical waveguide. By providing a positioning member, the optical element does not need to be mounted on the plane of the mounting member. Therefore, the design freedom of the size of the optical element is increased.

It should be noted that the material of the positioning member may be a material of high thermal conductivity. Because the heat of the optical element can be released, that is to say, be subject to heat sink treatment. The material of the positioning member may be an electrically conductive material. Because it can be used as an electrode. In this case, as a particular material for the positioning member may preferably be used, for example, copper or the like.

The optical module of the present invention may include a semiconductor chip mounted on the plane of the mounting member and electrically connected to the optical element, and the positioning member may be mounted on a side surface of the semiconductor chip.

In the optical module of the present invention, the positioning member may be positioned lower than the semiconductor element formation plane of the semiconductor chip.

As a method of mounting the positioning member on the side surface of the semiconductor chip, the use of an adhesive may be considered. In this case, the adhesive may spread out from between the positioning member and the side surface of the semiconductor chip. In this event, when the positioning member is positioned on a level same as or higher than the semiconductor element formation plane of the semiconductor chip, the adhesive may adhere to the semiconductor element formation plane of the semiconductor chip. On the semiconductor element formation plane, an electronic circuit is formed from semiconductor elements. Therefore, for example, when the adhesive is electrically conductive, the electronic circuit may be shorted.

It should be noted that when there is an excess of adhesive between the positioning member and the side surface of the semiconductor chip, there is a risk of the positioning member being inclined. Should this occur, the positioning member will not be able to be precisely adhered to the side surface of the semiconductor chip. Therefore, a space for absorbing excess adhesive may be provided between the positioning member and the side surface of the semiconductor chip. As means of forming the space, of the surfaces of the positioning member, a foot portion may be provided or a recess may be formed on a surface contacting the side surface of the semiconductor chip.

The material properties of the adhesive may be selected, depending on the characteristics required of the adhesive, from electrical conductivity, electrical insulation, thermal conductivity and thermal insulation.

In the optical module of the present invention, the mounting member may include a first interconnect, and the positioning member may contact the first interconnect. As described above, the positioning member may function as an electrode or function as a heat sink. By the positioning member contacting the first interconnect, the positioning member can be made to function as an electrode. When the positioning member is functioning as a heat sink, heat can flow from the positioning member to the first interconnect. Therefore, the heat releasing effect is further improved.

The mounting member may include a second interconnect, and an electrode of the optical element may extend to the second interconnect, and be electrically connected to the second interconnect.

Wire bonding may be considered as means for electrically connecting the upper electrode and the second interconnect. When the upper electrode is not facing vertically upwards, high level wire bonding technology is required. As a result of disposing the optical element so that the light travels in a direction along the plane of the mounting member, it may no longer be possible for the upper electrode to face upwards. In this case, by applying the structure that the upper electrode extends to the second interconnect, the electrical connecting portion between the upper electrode and the second interconnect is made easy.

In the optical Module of the present invention, the optical module may be packaged by sealing with a light-blocking resin, and an optical path between the optical element and the optical waveguide may be filled with a light-transmitting resin. By packaging the optical module with resin, the general applicability and ease of handling of the optical module are improved. The reason for a light-blocking resin is used is that there is a risk of malfunction of the electronic circuit when natural light or light from an optical element reaches the electronic circuit mounted on the mounting member. However, the optical path is assured by filling the location forming the optical path with light-transmitting resin.

The optical module of the present invention may further comprise a mounting surface to be mounted on another mounting member, and the optical waveguide may extend in the direction along the mounting surface.

The present invention further provide a method of manufacturing an optical module, the optical module comprising; a mounting member; and an optical element mounted on a plane of the mounting member, and the optical element is formed on a semiconductor substrate, emits light in a direction perpendicular to the plane of the semiconductor substrate, and admits light from a direction perpendicular to the plane of the semiconductor substrate; the optical module further comprises an optical waveguide mounted on the plane of the mounting member and guiding light emitted from the optical element or light admitted to the optical element; the method comprises: a step of disposing the optical element so that a side surface of the semiconductor substrate faces a plane of the mounting member; a step of electrically connecting an upper electrode of the optical element to another electrode; and a step of disposing the optical waveguide in a direction along the plane of the mounting member.

The upper electrode of the optical element is positioned on the plane of the semiconductor substrate of the optical element. Therefore, when the optical element is disposed so that the side surface of the semiconductor substrate of the optical element faces the plane of the mounting member, the upper electrode faces horizontally. When the upper electrode of the optical element is electrically connected to another electrode, for example, by wire bonding, mounting the optical waveguide previously impairs the connection. However such a problem does not occur in the present invention, because the optical waveguide is disposed on the plane of the mounting member after electrically connecting the upper electrode to another electrode.

BEST MODE FOR CARRYING OUT THE INVENTION

First Embodiment (Structure)

Figure 1:
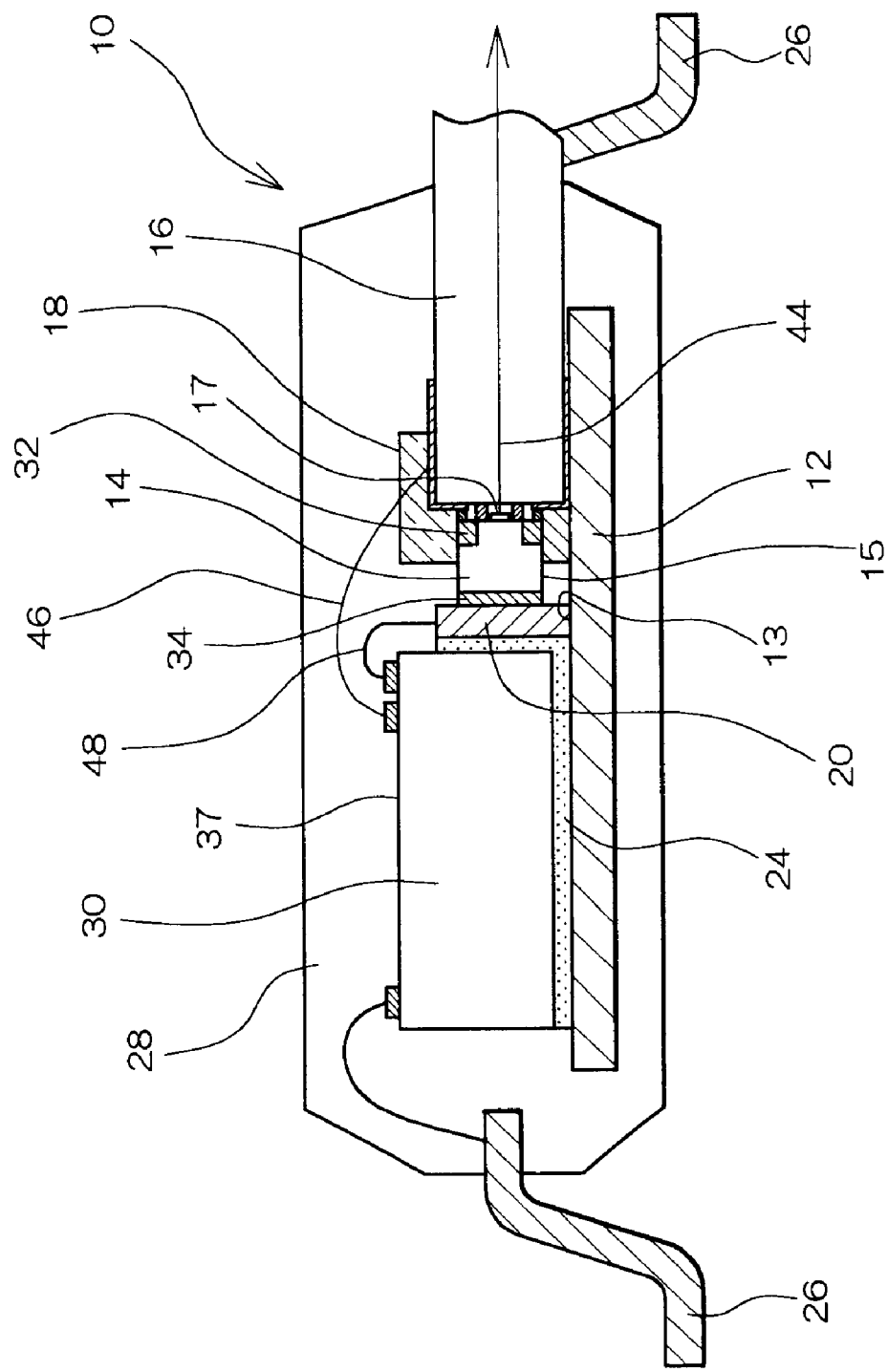
FIG. 1 shows a first embodiment of an optical module of the present invention.
Figure 2:
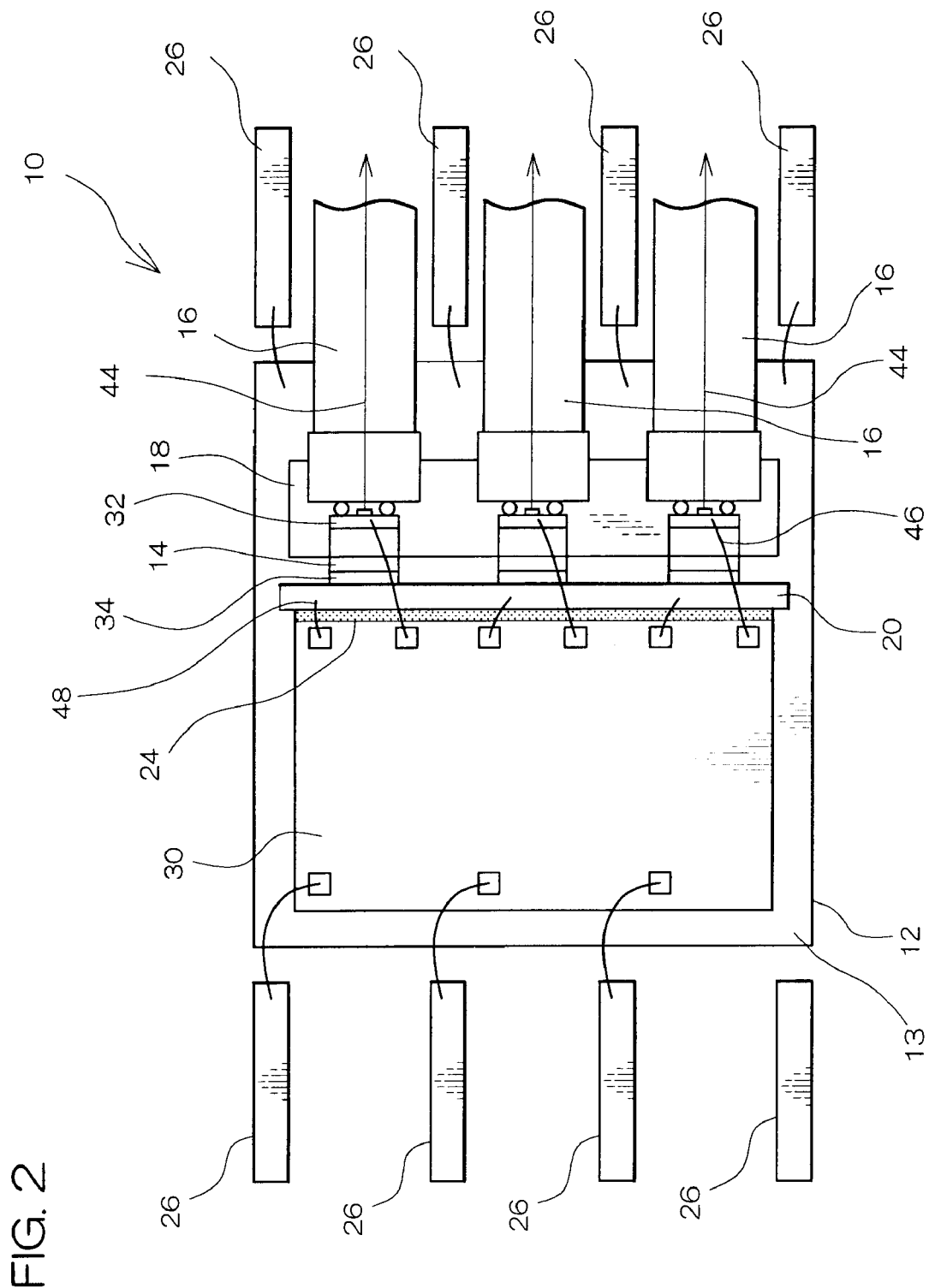
FIG. 2 shows a schematic plan view of the first embodiment of the optical module of the present invention.

FIG. 1 is a schematic sectional view of a first embodiment of the optical module according to the present invention. FIG. 2 shows a schematic plan view thereof.

With reference to FIGS. 1 and 2, the construction of the first embodiment is now described. An optical module 10 adopts an SOP or QFP type mounting configuration. The optical module 10 has a surface emission laser 14, a semiconductor chip 30, and an optical fiber 16 mounted on a plane 13 of a mounting substrate 12. The plane 13 of the mounting substrate 12 is either surface of the mounting substrate 12. The plane 13 of the mounting substrate 12 is the surface facing the inside of the package. The mounting substrate 12 may also be part of a lead frame, for example, a die pad section. The mounting substrate 12 is preferably formed of a material with a low coefficient of thermal expansion, for example, ceramic or metal. Since the expansion and contraction of the mounting substrate 12 is small, positional discrepancies between the surface emission laser 14 and the optical fiber 16 hardly occur. In particular, when the mounting substrate 12 is formed of a material of high thermal conductivity, for example, a metal, the thermal emission is improved. There are three surface emission lasers 14 and three optical fibers 16. In this embodiment, as an example of a plurality of Optical elements, a plurality of surface emission lasers 14 is provided, but the present invention is not limited to this. For example, a single optical element may be provided, and this optical element may have a plurality of light admitting or light emitting apertures. A single optical element having a single light admitting or light emitting aperture may be provided, and in this regard an appropriate decision may be made for the implementation in question.

The surface emission laser 14 is disposed so that a side surface 15 of the surface emission laser 14, that is to say, a surface formed substantially perpendicular to the surface which includes the light emitting or light admitting aperture opposes the plane 13 of the mounting substrate 12. By this means, light 44 emitted from the light emitting aperture 17 of the surface emission laser 14 travels in a direction along the plane 13 of the mounting substrate 12.

In this embodiment, a single semiconductor chip 30 is provided, but a plurality of semiconductor chips 30 may equally be provided. For example, a plurality of semiconductor chips 30 may be provided, corresponding to a plurality of optical elements.

A CMOS circuit is formed on the semiconductor chip 30, Drive signals are sent from this CMOS circuit to the surface emission laser 14. The semiconductor chip 30 drives the surface emission laser 14 being one example of an optical element. The semiconductor chip 30 may have functions for controlling signals or data for driving the optical element. It should be noted that when the optical element (particularly in the case of a light-receiving element) has an internal drive circuit, then the semiconductor chip 30 may be omitted.

The three surface emission lasers 14 are fixed to a positioning plate 20. The positioning plate 20 is a member for positioning the surface emission lasers 14. As a positioning member, a certain stiffness is required of the material itself. As the material of the positioning plate 20 may be used, for example, metal, plastic, or the like. When the positioning plate is sealed with a thermosetting resin, it is preferable to be a material capable of withstanding at least the temperature applied to the sealant for thermal curing. The positioning plate 20 may, for example, have at least either of an electrode function and a function of a heat sink (radiating member). When this positioning plate 20 is given, for example, the function of an electrode, the material used for a normal electrode may be used as the material of the positioning plate 20. This may be, for example, any of gold, silver, copper, aluminum, nickel, or the like. On the other hand, when the positioning plate 20 is given the function of a heat sink, radiating material that is any of gold, silver, copper, aluminum, nickel, ceramic, or the like, may be considered. Any of gold, silver, copper, or nickel may be appropriate for giving the function of an electrode and the function of a heat sink (radiating material) to the positioning plate 20. The positioning plate 20 is mounted on the plane 13 of the mounting substrate 12. The positioning plate 20 is adhered to the side surface of the semiconductor chip 30 by an adhesive 24. When electrical insulation is required between the positioning plate 20 and the semiconductor chip 30, then as the adhesive 24 may be used an insulating material, such as thermosetting epoxy resin. When the positioning plate 20 has a heat sink function, it is possible to combine a material of sufficient thermal conductivity with the adhesive 24. For example, by combining the epoxy resin with a filler of silica, alumina, or the like, thermal conduction properties can be provided, in addition to the function as the adhesive 24. In case the thermal conduction is to be further improved, the use of silver paste can also be considered. It should be noted that since silver paste is electrically conductive, it is positively preferable to use silver in the case where an electrical conduction is desired.

The positioning plate 20 is disposed so that the surface emission laser 14 is connected to the optical fiber 16. The end of the optical fiber 16 and the surface emission laser 14 is positioned as shown in FIG. 1. The positioning plate 20 is positioned lower than the formation plane 37 of the semiconductor element of the semiconductor chip 30. By this means, contact of the electrodes of the semiconductor chip 30 with the positioning plate 20 can be prevented. The connecting portion between the surface emission laser 14 and the optical fiber 16 is covered by a transparent resin 18. By this means, the optical path between the surface emission laser 14 and the optical fiber 16 is filled with the transparent resin 18.

The surface emission laser 14 is provided with an upper electrode 32 and a lower electrode 34. The lower electrode 34 contacts the positioning plate 20. The positioning plate 20 is electrically connected to the semiconductor chip 30 by a wire 48. Therefore, the lower electrode 34 is electrically connected to the semiconductor chip 30 through the positioning plate 20 and wire 48. The upper electrode 32 is electrically connected to the semiconductor chip 30 by a wire 46. After the optical fiber 16 is disposed on the plane 13 of the mounting substrate 12, it is subjected to wire bonding.

On both sides of the mounting substrate 12, external terminals 26 are provided. The mounting substrate 12, a part of the external terminals 26, and a part of the optical fiber 26 are sealed with a light-blocking resin 28. Note that in FIG. 2, the resin 28 has been omitted from the drawing.

(Effect)

(a) The first embodiment has the surface emission laser 14 disposed so that the light 44 travels in the direction along the plane of the mounting substrate 12. Therefore, the optical fiber 16 can be disposed so that the light 44 within the optical fiber 16 travels in the direction along the plane 13 of the mounting substrate 12. As a result, the optical module 10 can be made thinner.

(b) The first embodiment comprises the positioning plate for positioning the surface emission laser 14. The positioning plate 20 is mounted on the plane of the mounting substrate 12. Therefore, in order to fix the surface emission laser 14, it is no longer necessary to mount the surface emission laser 14 on the plane of the mounting substrate 12. Therefore, the design freedom of the size of the surface emission laser 14 is increased.

(c) In the first embodiment, the material of the positioning plate 20 has high thermal conductivity. Therefore, the positioning plate 20 can release the heat of the surface emission laser 14.

(d) In the first embodiment, the material of the positioning plate 20 is electrically conductive. Therefore, the positioning plate 20 can be used as an electrode. In this embodiment, it functions as a common electrode of the three surface emission lasers 14.

(e) In the first embodiment, the positioning plate 20 is adhered to the side surface of the semiconductor chip 30. The positioning plate 20 is positioned lower than the semiconductor element formation plane 37. The adhesive 24 may spread out from between the positioning plate 20 and the side surface of the semiconductor chip 30. When the adhesive 24 adheres to the semiconductor element formation plane 37, the circuit of the semiconductor chip 30 will be shorted. With this construction, however, even when for example the adhesive 24 spreads out, the possibility of the adhesive 24 adhering to the semiconductor element formation plane 37 can be reduced.

(f) In the first embodiment, the positioning plate 20 is mounted on the plane of the mounting substrate 12. As described above, the positioning plate 20 functions as an electrode and heat sink. Therefore, the positioning plate 20 can be connected to a power supply or connected to ground. Heat can be released from the positioning plate 20, and to the mounting substrate 12. Therefore, the heat radiation effect can be further increased.

(g) The upper electrode 32 is positioned on the plane of the semiconductor substrate of the surface emission laser 14. The surface emission laser 14 is disposed so that the side surface 15 of the semiconductor substrate of the surface emission laser 14 faces the plane 13 of the mounting substrate 12. Therefore, the upper electrode 32 faces in the horizontal direction. Therefore, when the upper electrode 32 and semiconductor chip 30 are electrically connected by the wire 46, when the optical fiber 16 is already in place, the connection will be impeded. In the first embodiment, this problem does not occur, because the optical fiber 16 is disposed on the plane 13 of the mounting substrate 12 after the wire bonding.

(h) In the first embodiment, the optical module 10 is sealed in a package with a light-blocking resin 28, and the optical path between the surface emission laser 14 and the optical fiber 16 is filled with a transparent resin 18 being a light-transmitting resin. By packaging the optical module 10 with the light-blocking resin 28, the general applicability of the optical module 10 and the ease of handling are improved. The light-blocking resin 28 can protect the electronic circuit of the semiconductor chip 30 from natural light and light from optical elements. By this means, malfunction of the electronic circuit can be prevented. However, the optical path is assured by filling the locations forming the optical path with the transparent resin 18.

Second Embodiment (Structure)

Figure 3:
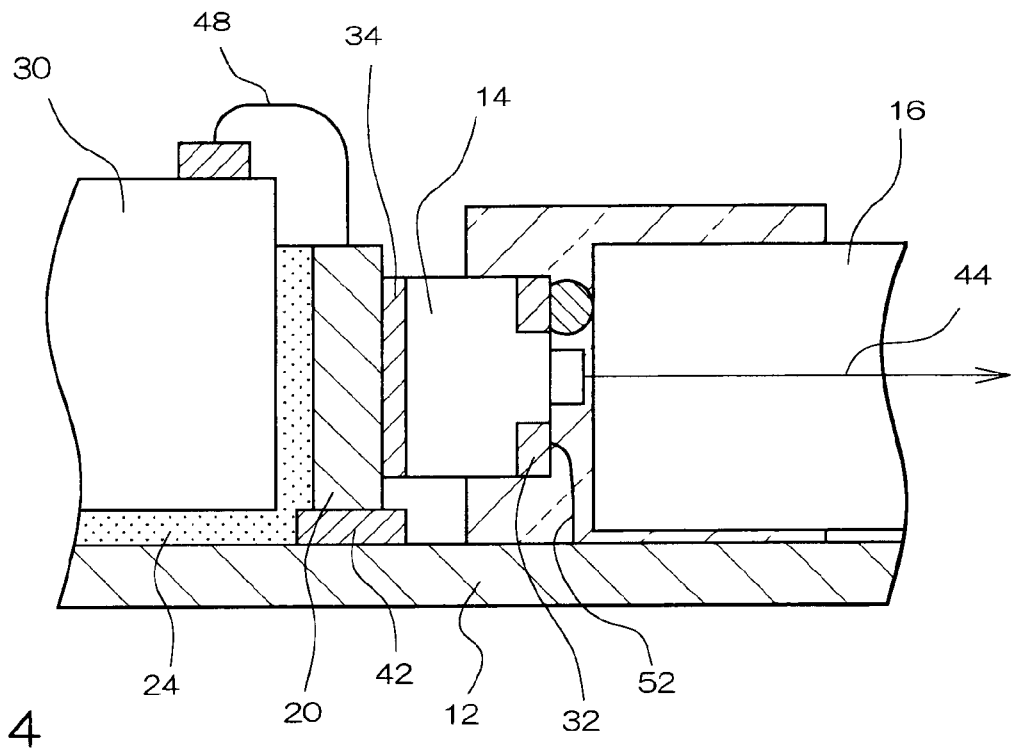
FIG. 3 shows a second embodiment of the optical module of the present invention.

FIG. 3 is a partial schematic sectional view showing a second embodiment of the optical module according to the present invention. It shows the location of the surface emission laser 14. In the second embodiment, the upper electrode 32 of the surface emission laser 14 is electrically connected by the plane of the mounting substrate 12 which is a lead frame, and a wire 52. Therefore, in order to avoid shorting of the lower electrode 34 and upper electrode 32 an insulating portion 42 is formed on the plane of the mounting substrate 12. The positioning plate 20 is disposed on the insulating portion 42. The insulating portion 42 is formed by oxidizing a part of the plane of the mounting substrate 12. The insulating portion 42 may be formed by applying insulating tape to a part of the plane of the mounting substrate 12. In this point, the second embodiment is different from the first embodiment. Otherwise, the construction is the same as in the first embodiment. Therefore, the same reference numerals are used for parts the same as in the first embodiment and description is omitted here. It should be noted that in this embodiment, positioning of the surface emission laser 14 and optical fiber 16 is carried out as shown in FIG. 3.

(Effect)

The second embodiment has the same effect as the first embodiment. However, of the effect in (f), since the insulating portion 42 is present, the positioning plate 20 cannot be electrically connected to the mounting substrate 12.

Third Embodiment (Structure)

Figure 4:
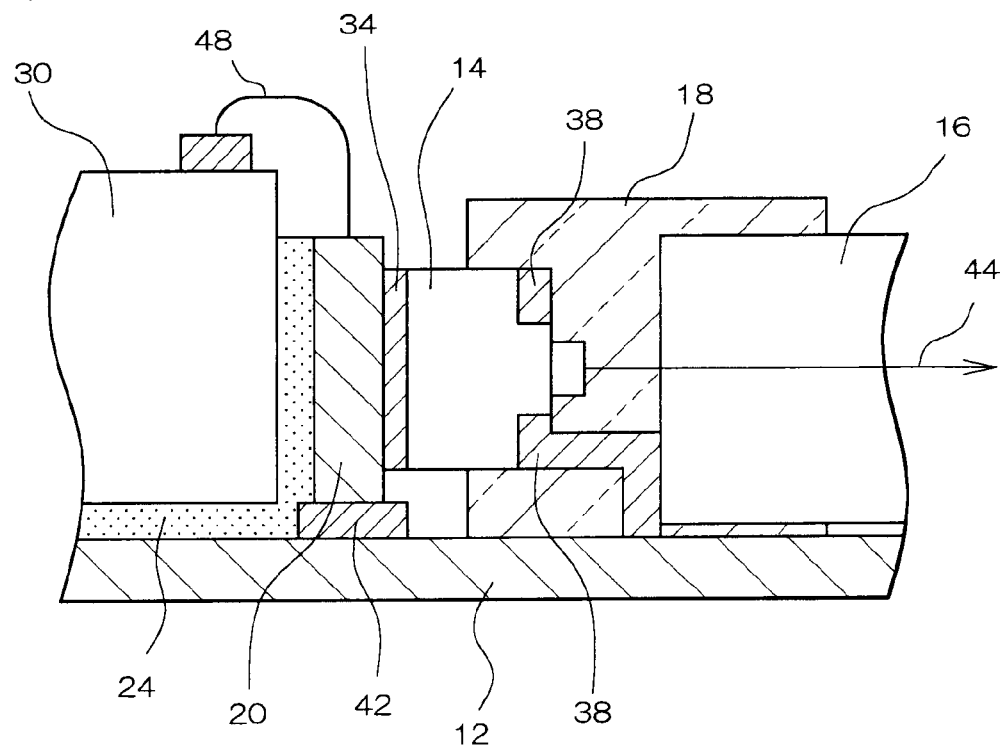
FIG. 4 shows a third embodiment of the optical module of the present invention.

FIG. 4 is a partial schematic sectional view of a third embodiment of the optical module according to the present invention. It shows the location of the surface emission laser 14. In the third embodiment, an upper electrode 38 of the surface emission laser 14 extends as far as the mounting substrate 12 which is a lead frame and is electrically connected to the mounting substrate 12. In this point, the third embodiment is different from the second embodiment. Otherwise, the construction is the same as in the second embodiment. Therefore, the same reference numerals are used for parts the same as in the second embodiment and description is omitted here. It should be noted that in this embodiment positioning of the surface emission laser 14 and optical fiber 16 is carried out as shown in FIG. 4

(Effect)

The third embodiment has the same effect as the second embodiment. Further, it has the following particular effect.

The upper electrode 19 faces in the vertical direction. When using wire bonding to electrically connect the upper electrode 38 and the mounting substrate 12, this construction requires high level technology for wire bonding. In the third embodiment, the upper electrode 38 extends to the mounting substrate 12. This structure makes the electrical connection of the upper electrode 38 and the mounting substrate 12 easy.

Fourth Embodiment (Structure)

Figure 5:
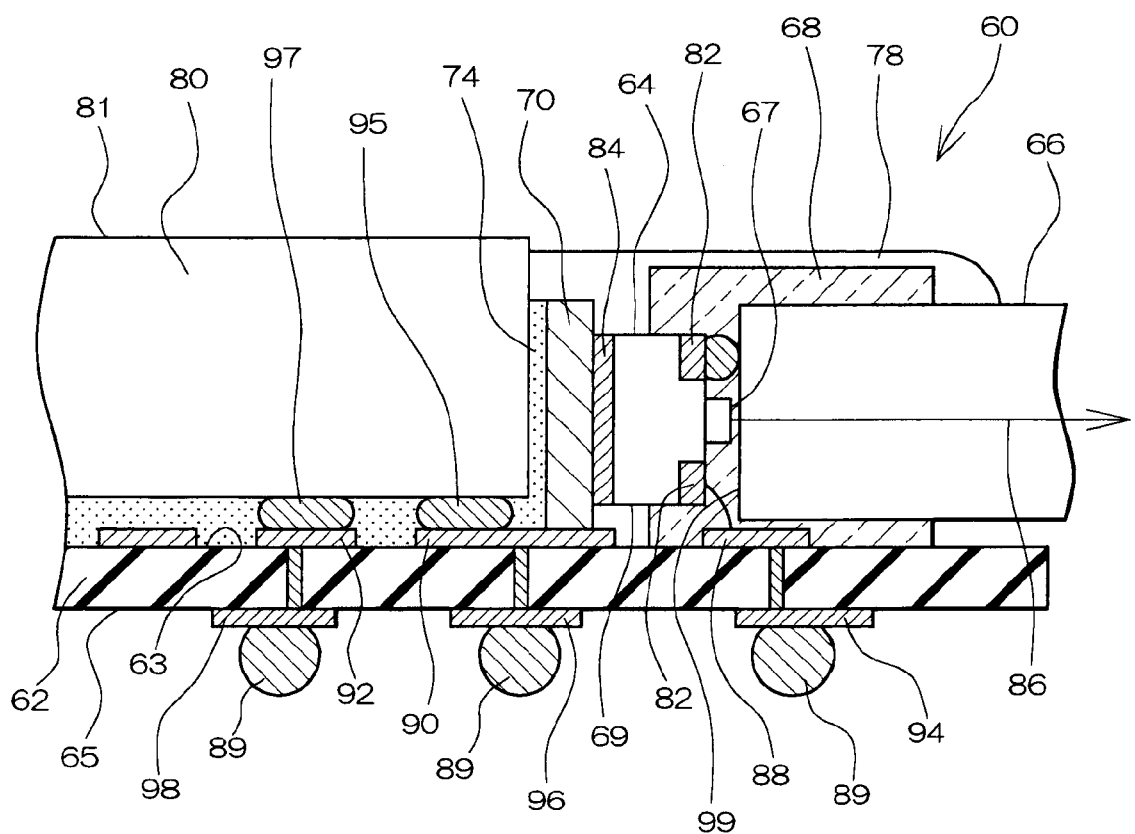
FIG. 5 shows a fourth embodiment of the optical module of the present invention.

FIG. 5 is a partial schematic sectional view of a fourth embodiment of the optical module according to the present invention. An optical module 60 has a BGA or CSP mounting configuration. It comprises a surface emission laser 64, a semiconductor chip 80, and an optical fiber 66 mounted on a plane 63 of a mounting substrate 62. Although not shown in the drawing, as in the first embodiment, there are three surface emission lasers 64, three semiconductor chips 80, and three optical fibers 66. The surface emission laser 64 is disposed so that a side surface 69 of the semiconductor substrate of the surface emission laser 64 faces the plane 63 of the mounting substrate 62. By this means, the direction of light 86 emitted from a light emitting aperture 67 of the surface emission laser 64 is along the plane 63 of the mounting substrate 62. A CMOS circuit is formed on the semiconductor chip 80. Drive signals are sent from this CMOS circuit to the surface emission laser 64.

On the plane 63 of the mounting substrate 62 are formed interconnects 88, 90, and 92, and on a back surface 65 are formed interconnects 94, 96, and 98. The back surface 65 becomes the mounting surface to be mounted on another mounting substrate. The interconnect 88 is electrically connected to the interconnect 94, the interconnect 90 is electrically connected to the interconnect 96, and the interconnect 92 is electrically connected to the interconnect 98. Bump electrodes 89 are formed on the interconnects 94, 96, and 98. It should be noted that a land grid array in which the bump electrodes 89 are omitted may also be adopted.

The surface emission laser 64 is fixed to a positioning plate 70 formed of, for example, copper. The positioning plate 70 functions as an electrode and heat sink. The positioning plate 70 is disposed on the interconnect 90. The positioning plate 70 is adhered to the side surface of the semiconductor chip 80, for example, by silver paste 74.

The positioning plate 70 is disposed so that the surface emission laser 64 is connected to the optical fiber 66. The positioning plate 70 is positioned lower than a semiconductor element formation plane 81 of the semiconductor chip 80. The connecting portion between the surface emission laser 64 and the optical fiber 66 is covered by a transparent resin 68.

The surface emission laser 64 is provided with an upper electrode 82 and a lower electrode 84. The lower electrode 84 contacts the positioning plate 70. The positioning plate 70 is connected to the power supply or ground through the interconnects 90 and 96. The upper electrode 82 is electrically connected to the interconnects 88 and 94 by a wire 99. Drive signals are transmitted to the upper electrode 82 through the interconnect 94. It should be noted that in place of the wire 99, the upper electrode 82 may be formed to extend to the interconnect 88 as in the third embodiment.

Bump electrodes 95 and 97 are formed on the semiconductor chip 80. The bump electrode 95 is electrically connected to the interconnect 90, and the bump electrode 97 is electrically connected to the interconnect 92. A part of the optical fiber 66, the semiconductor chip 80, and the surface emission laser 64 are sealed with a light-blocking resin 28. It should be noted that in this embodiment, the surface emission laser 64 and optical fiber 66 are positioned as shown in FIG. 5.

(Effect)

The fourth embodiment has the same effect as the first embodiment. As in the third embodiment, the upper electrode 82 may extend as far as the interconnect 88 in place of the wire 99. This provide the same effect as the third embodiment.

It should be noted that in the first to fourth embodiments, optical fibers 16 and 66 are used. However, the present invention may equally be applied to an optical waveguide using a glass substrate, plastic film, or the like.

In the first to fourth embodiments, surface emission lasers 14 and 64 are used. However, the present invention may equally be applied to a light-emitting element such as an LD or a light-receiving element such as a PD.

Fifth Embodiment

Figure 6:
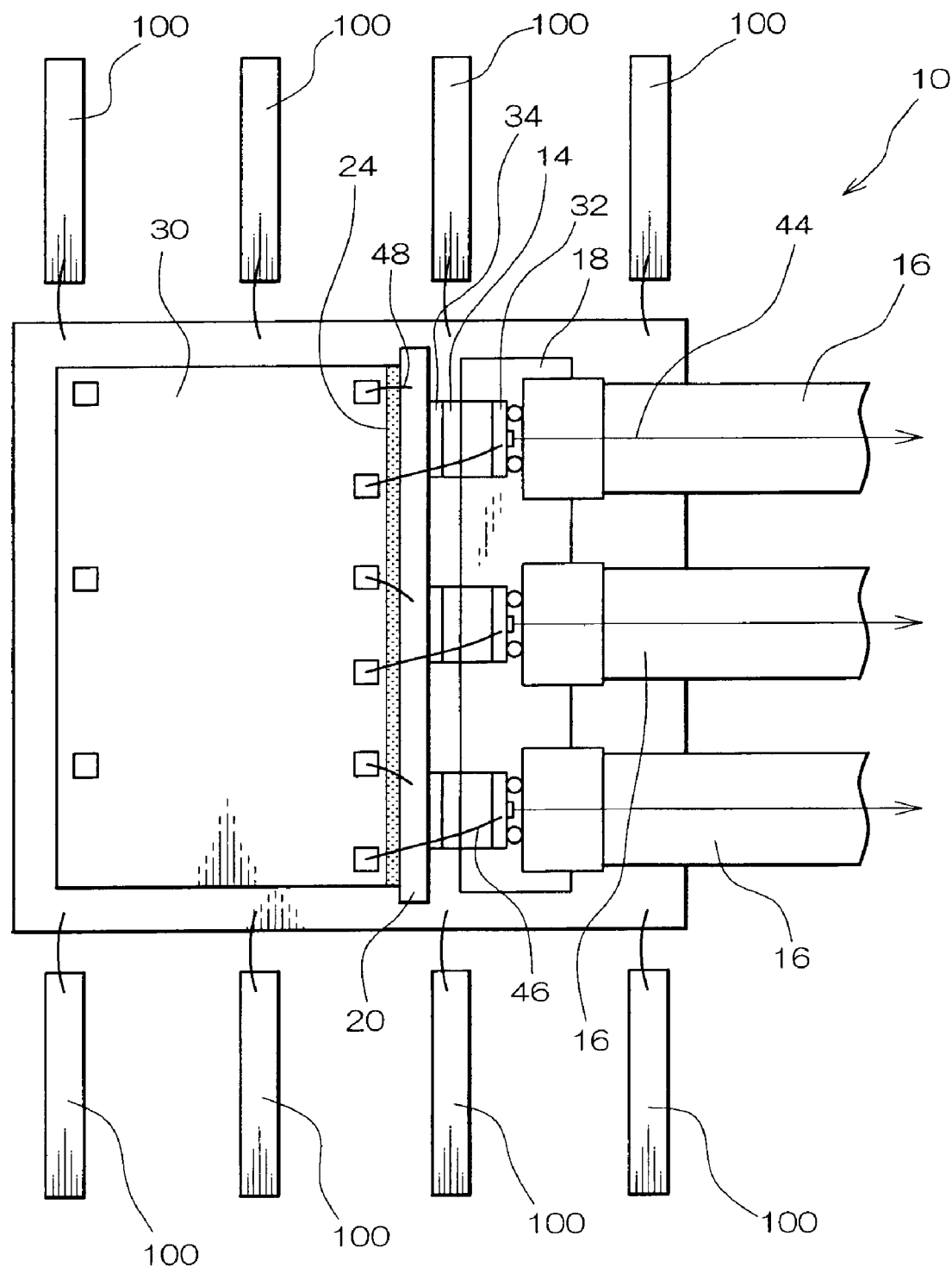
FIG. 6 shows a fifth embodiment of the optical module of the present invention.

FIG. 6 shows a fifth embodiment of the optical module. The optical module shown in this figure has the external terminals disposed at different positions from the external terminals 26 of the optical module shown in FIG. 2. Specifically, in the example shown in FIG. 2, the direction in which the optical fiber 16 is brought out is the same as the direction in which the external terminals 26 are brought out. On the other hand, in the example shown in FIG. 6, the direction in which the optical fiber 16 is brought out is different from the direction in which external terminals 100 are brought out. For example, when the surface emission laser 14 being an example of an optical element has a rectangular shape in a package which seen in plan view, the optical fiber 16 and external terminals 26 are brought out from the same side in the example shown in FIG. 2. On the other hand, in the example shown in FIG. 6, the optical fiber 16 and external terminals 100 are brought out from different sides. More Specifically, in the example shown in FIG. 6, the optical fiber 16 is brought out from one side, and the external terminals 100 are brought out from the two adjacent sides connecting at right angles to the side where the optical fiber 16 is brought out. By this means, a number of optical fibers 16 and external terminals 100 can be provided. It should be noted that the optical fibers 16 may also be brought out from two parallel sides. It should be noted that in this embodiment, the surface emission laser 64 and optical fiber 66 are positioned as shown in FIG. 6.

Light Transmission Device

Figure 7:
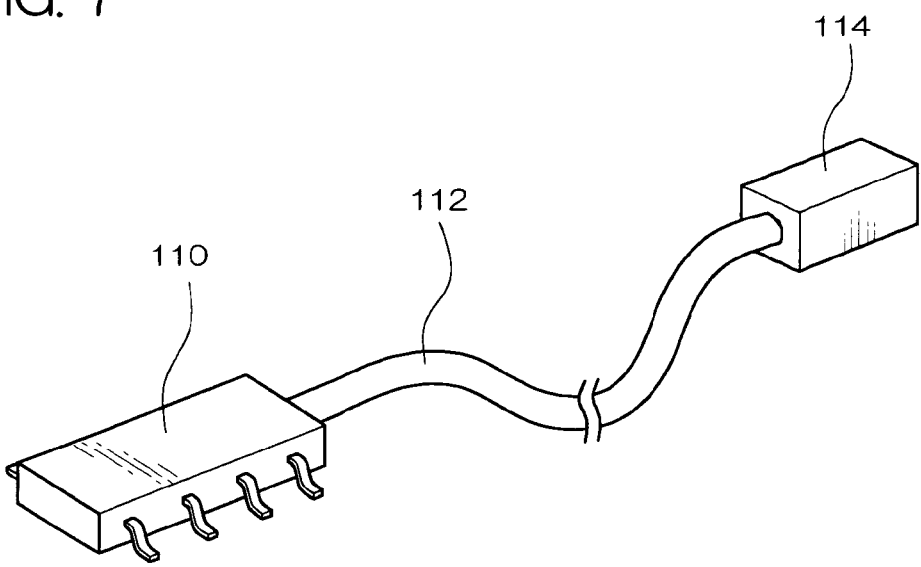
FIG. 7 shows an optical transmission device using the optical module of the present invention.

The above-described optical module can be used to constitute a light transmission device. For example, the optical transmission device shown in FIG. 7 comprises an optical module 110, a cable 112, and a connector 114. The cable 112 includes a bundle of at least one (in most cases a plurality of) optical fiber (not shown in drawings) brought out from the optical module 110.

Figure 8:
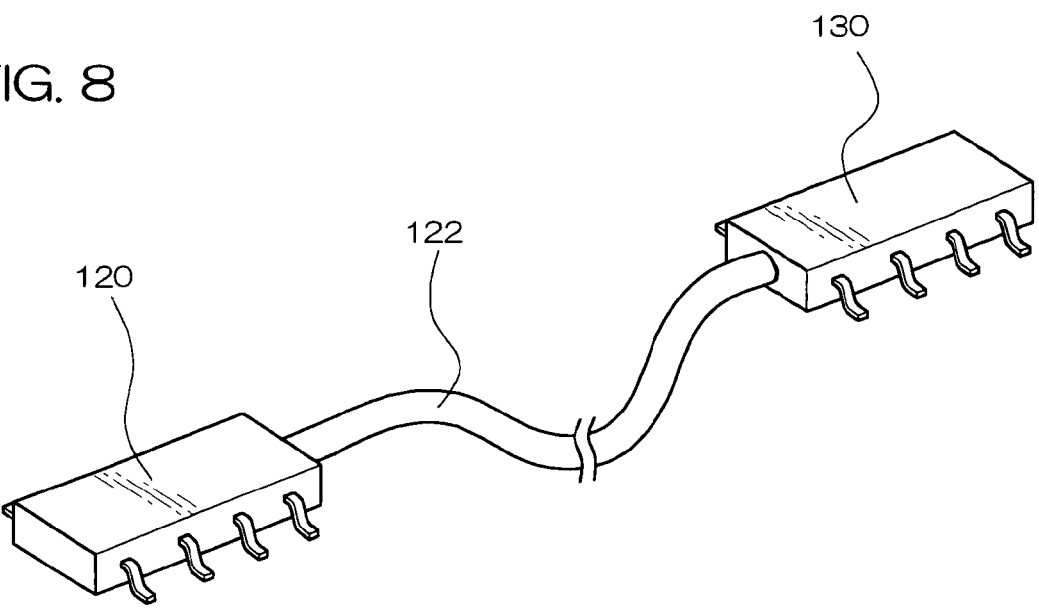
FIG. 8 shows an optical transmission device using the optical module of the present invention.

The optical transmission device shown in FIG. 8 has at least one optical module 120 and at least one optical module 130 attached to both ends of a cable 122. The cable 122 includes a bundle of at least one (in most cases a plurality of) optical fiber (not shown in drawings).

Figure 9:
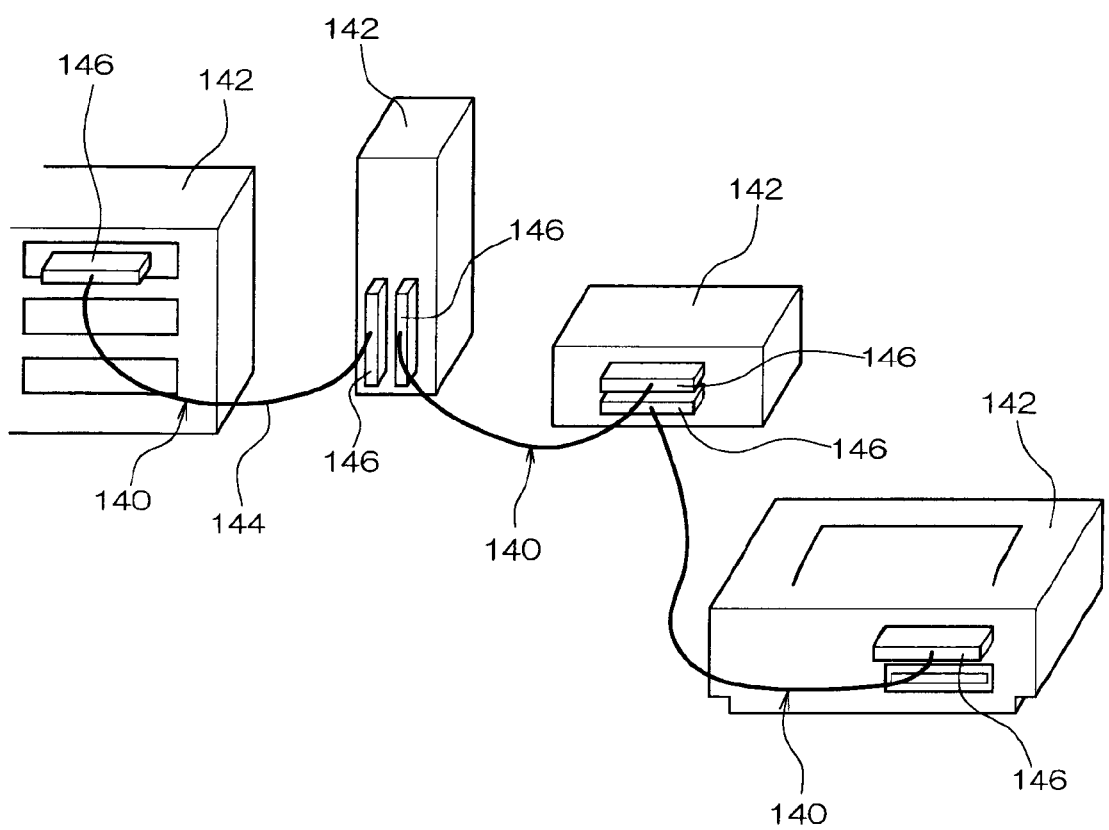
FIG. 9 shows an optical transmission device using the optical module of the present invention.

FIG. 9 shows an optical transmission device to which the embodiment of the present invention has been applied. An optical transmission device 140 is used to mutually connect electronic instruments 142 such as a computer, a display, a memory device, and a printer. The electronic instruments 142 may be data communications devices. The optical transmission device 140 may have plugs 146 provided at both ends of a cable 144. The cable 144 includes one or a plurality of (at least one) optical fiber 16 (see FIG. 1). At both ends of the optical fiber 16 an optical element is provided. The plugs 246 incorporate an optical element, and may also include the semiconductor chip 30.

The optical element optically connected to one end of the optical fiber 16 is a light-emitting element. An electrical signal outputted from one electronic instrument 142 is converted to a light signal by the light-emitting element. The light signal passes through the optical fiber, and is input to the optical element optically connected to the other end of the optical fiber 16. This optical element is a light-receiving element element, and converts the input light signal to an electrical signal. The electrical signal is input to the other electronic instrument 142. In this Wily, this embodiment of the optical transmission device 140 enables information to be transferred between the electronic instruments 142 by means of a light signal.

Sixth Embodiment (Structure)

Figure 10:
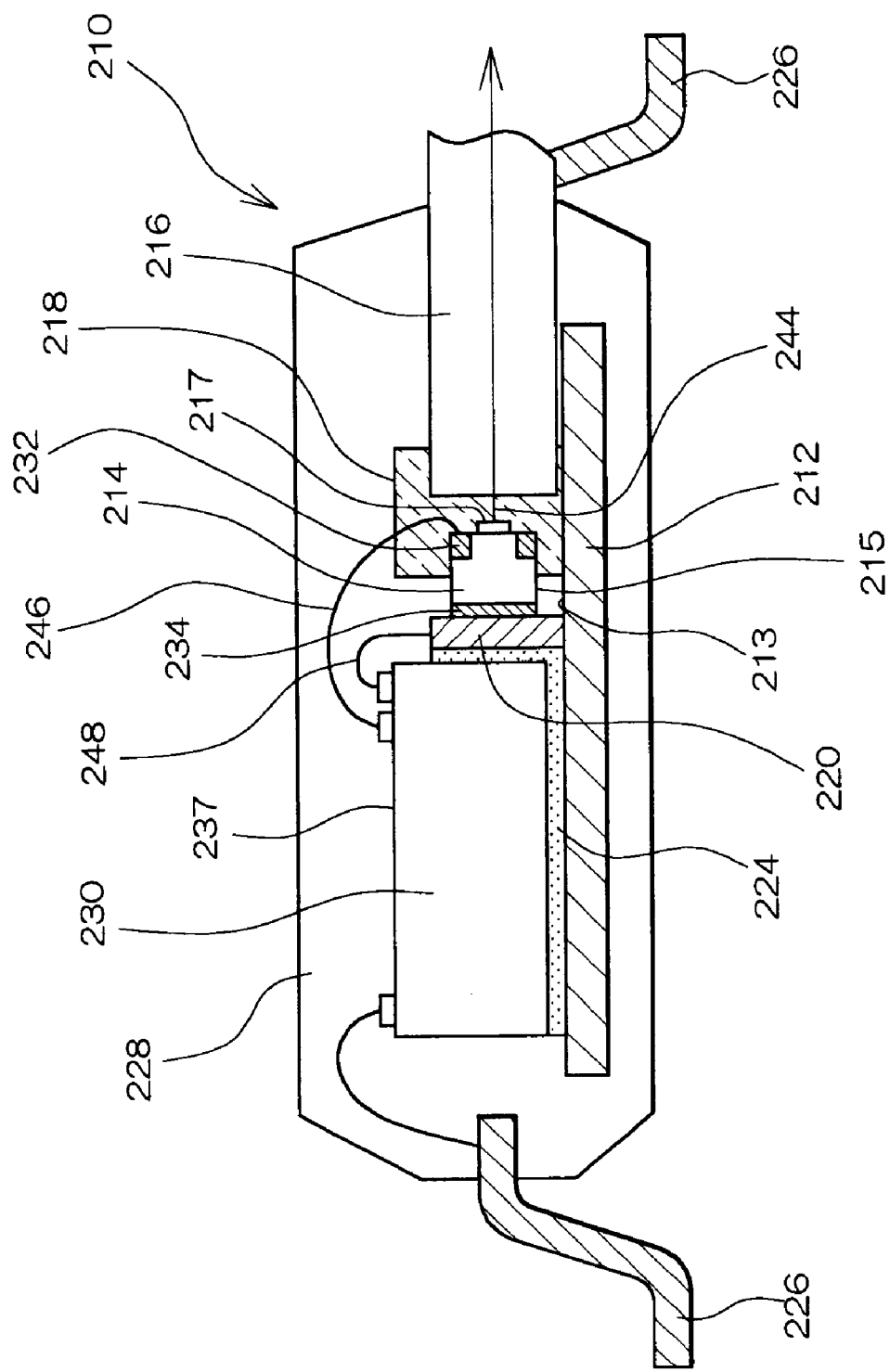
FIG. 10 shows a schematic sectional view of a sixth embodiment of the optical module of the present invention.
Figure 11:
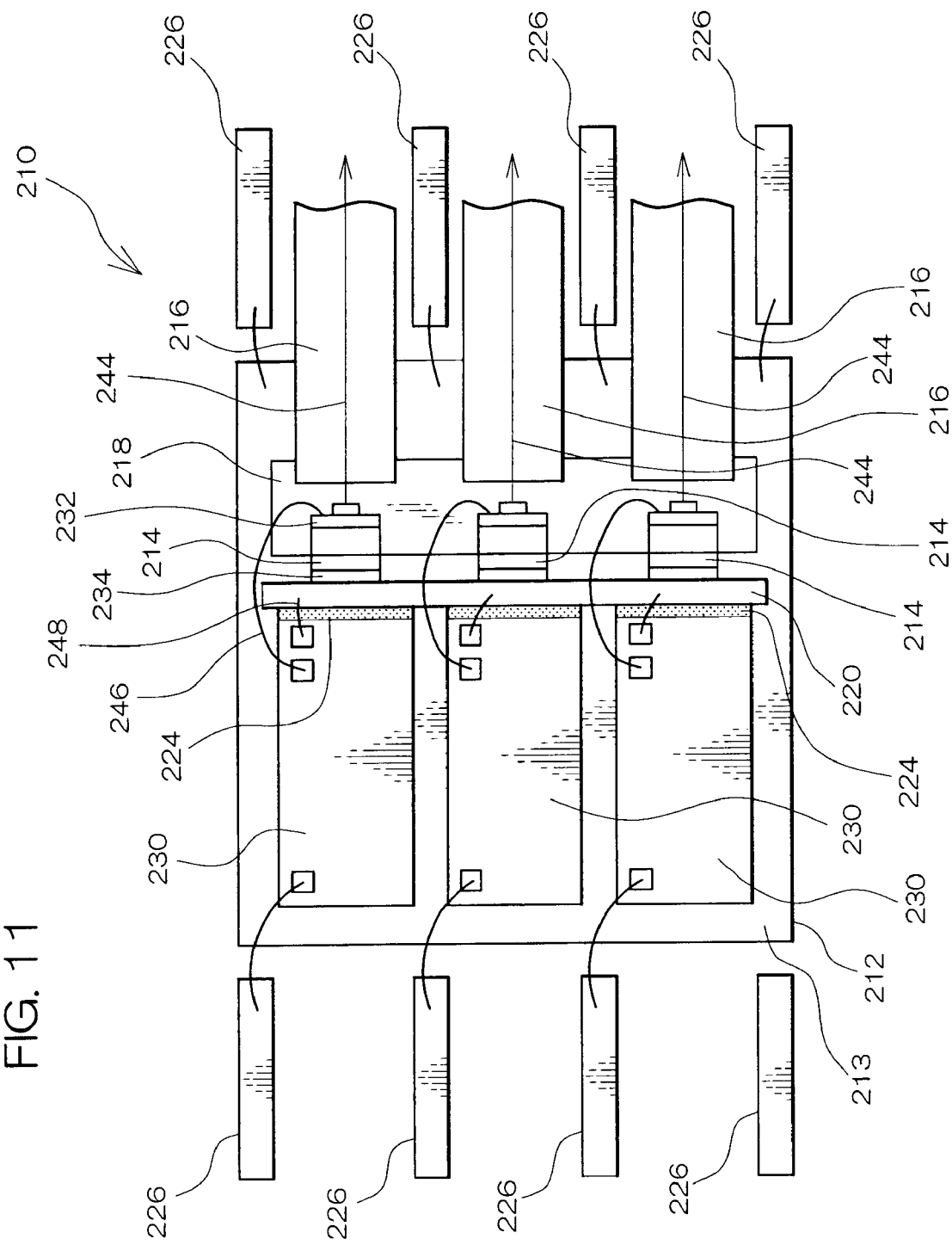
FIG. 11 shows a schematic plan view of the sixth embodiment of the optical module of the present invention.

FIG. 10 is a schematic sectional view of a sixth embodiment of the optical module according to the present invention. FIG. 11 is a schematic plan view thereof.

With reference to FIGS. 10 and 11, the structure of the sixth embodiment is now described. An optical module 210 adopts an SOP or QFP type mounting configuration. The optical module 210 has a surface emission laser 214, a semiconductor chip 230, and an optical fiber 216 mounted on a plane 213 of a mounting substrate 212. The mounting substrate 212 is a lead frame. There are three surface emission lasers 214, three semiconductor chips 230, and three optical fibers 216. The surface emission laser 214 is disposed so that side surface 215 of a semiconductor substrate of the surface emission laser 214 opposes the plane 213 of the mounting substrate 212. By this means, light 244 emitted from the light emitting aperture 217 of the surface emission laser 214 travels in the direction along the plane 213 of the mounting substrate 212. A CMOS circuit is formed on the semiconductor chip 230. Drive signals are sent from this CMOS circuit to the surface emission laser 214.

The three surface emission lasers 214 are fixed to a positioning plate 220 formed of, for example, copper. The positioning plate 220 has the functions of an electrode and a heat sink. The positioning plate 220 is mounted on the plane 213 of the mounting substrate 212. The positioning plate 220 is, for example, adhered to the side surface of the semiconductor chip 230 by an adhesive 224.

The positioning plate 220 is disposed so that the surface emission laser 214 is connected to the optical fiber 216. The positioning plate 220 is positioned lower than the formation plane 237 of the semiconductor element of the semiconductor chip 230. The connecting portion between the surface emission laser 214 and the optical fiber 216 is covered by a transparent resin 218. By this means, the optical path between the surface emission laser 214 and the optical fiber 216 is filled with the transparent resin 218.

The surface emission laser 214 comprises an upper electrode 232 and lower electrode 234. The lower electrode 234 contacts the positioning plate 220. The positioning plate 220 is electrically connected to the semiconductor chip 230 by a wire 248. Therefore, the lower electrode 234 is electrically connected to the semiconductor chip 230 through the positioning plate 220 and wire 248. The upper electrode 232 is electrically connected to the semiconductor chip 230 by a wire 246. After the optical fiber 216 is disposed on the plane of the mounting substrate 212, wire bonding is performed.

On both sides of the mounting substrate 212 are provided external terminals 226. The mounting substrate 212, a part of the external terminals 226, and a part of the optical fiber 226 are sealed with a light-blocking resin 228. Note that the resin 228 has been omitted from the drawing in FIG. 11.

The effect of this embodiment is the same as the effect of the first embodiment. The content of the description in the first embodiment can also be applied to this embodiment.

Seventh Embodiment (Structure)

Figure 12:
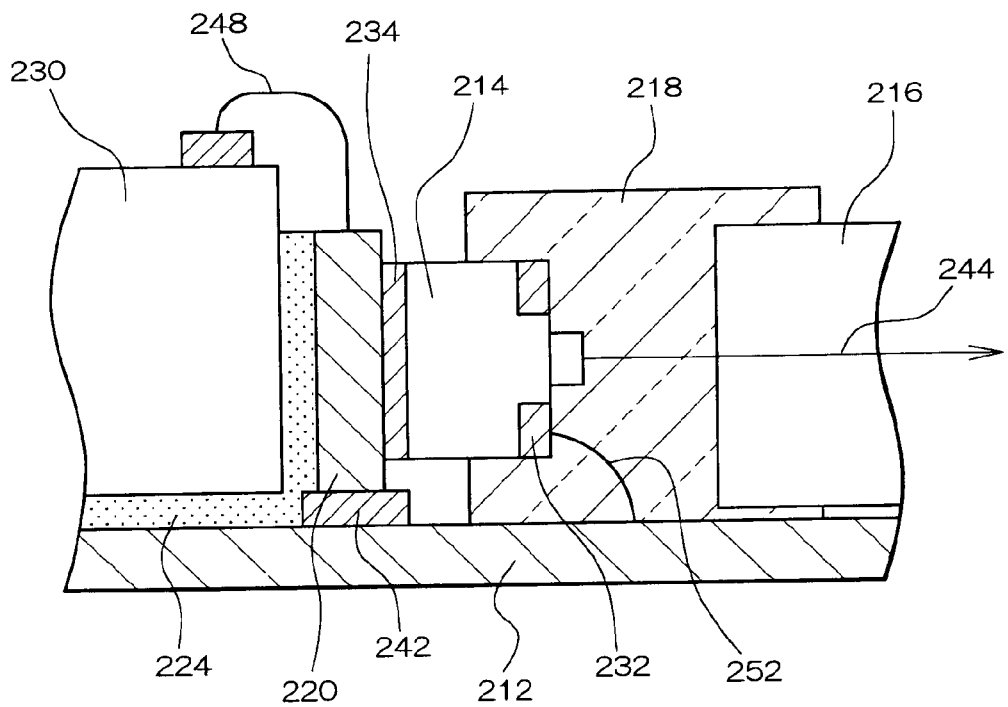
FIG. 12 shows a partial schematic sectional view of a seventh embodiment of the optical module of the present invention.

FIG. 12 is a partial schematic sectional view of a seventh embodiment of the optical module according to the present invention. It shows the location of the surface emission laser 214. In the seventh embodiment, the upper electrode 232 of the surface emission laser 214 is electrically connected by the plane of the mounting substrate 212 which is a lead frame, and a wire 252. Therefore, in order to avoid shorting of the lower electrode 234 and upper electrode 232 an insulating portion 242 is formed on the plane of the mounting substrate 212. The positioning plate 220 is disposed on the insulating portion 242. The insulating portion 242 is formed by oxidizing a part of the plane of the mounting substrate 211. The insulating portion 242 may be formed by applying insulating tape to a part of the plane of the mounting substrate 212. These are the differences between the seventh embodiment and the sixth, embodiment. Otherwise, the construction is the same as in the sixth embodiment. Therefore, the same reference numerals are used for parts the same as in the sixth embodiment and description is omitted here.

(Effect)

The seventh embodiment has the same effect as the first embodiment. The content of the description in the second embodiment can also be applied to this embodiment.

Eighth Embodiment (Structure)

Figure 13:
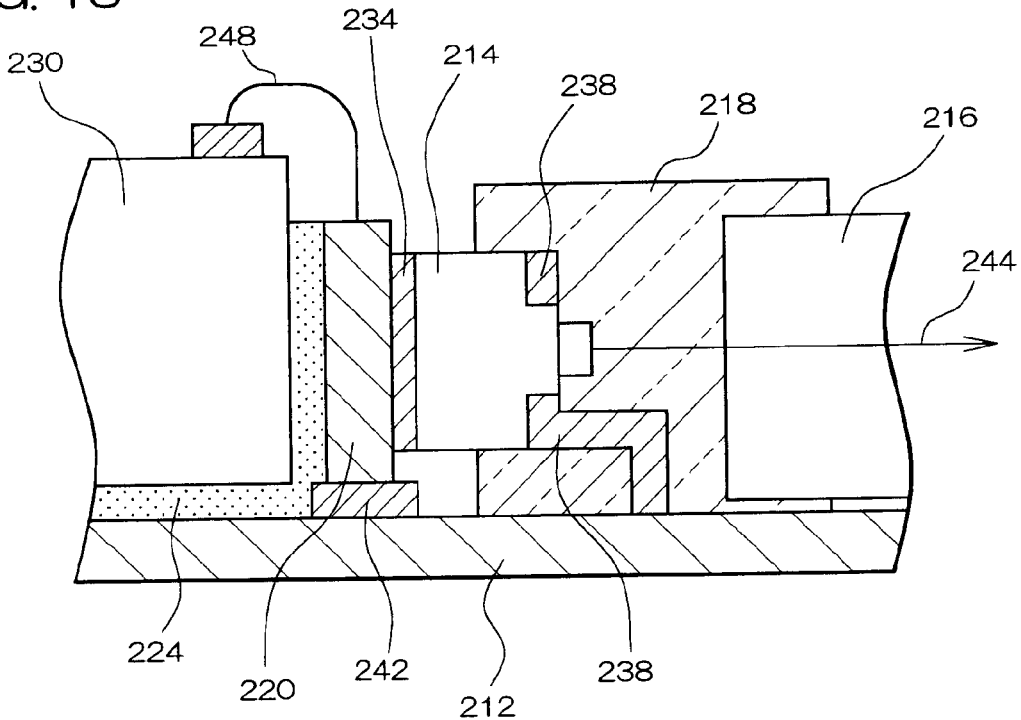
FIG. 13 shows a partial schematic sectional view of an eighth embodiment of the optical module of the present invention.

FIG. 13 is a partial schematic sectional view of an eighth embodiment of the optical module according to the present invention. It shows the location of the surface emission laser 214. In the eighth embodiment, an upper electrode 238 of the surface emission laser 214 extends as far as the mounting substrate 212 which is a lead frame, and is electrically connected to the mounting substrate 212. These are the differences between the eighth embodiment and the seventh embodiment. Otherwise, the construction is the same as in the seventh embodiment. Therefore, the sane reference numerals are used for parts the same as in the seventh embodiment and description is omitted here.

(Effect)

The eighth embodiment has the same effect as the seventh embodiment. Additionally, it has the following particular effect. The upper electrode 238 is aligned horizontally. When wire bonding is used to electrically connect the upper electrode 238 and the mounting substrate 212, this construction requires high level technology for wire bonding. As in the eighth embodiment, because the upper electrode 238 extends to the mounting substrate 212, the electrical connection between the upper electrode 238 and the mounting substrate 212 is easy.

The content of the description in the third embodiment can also be applied to this embodiment.

Ninth Embodiment (Structure)

Figure 14:
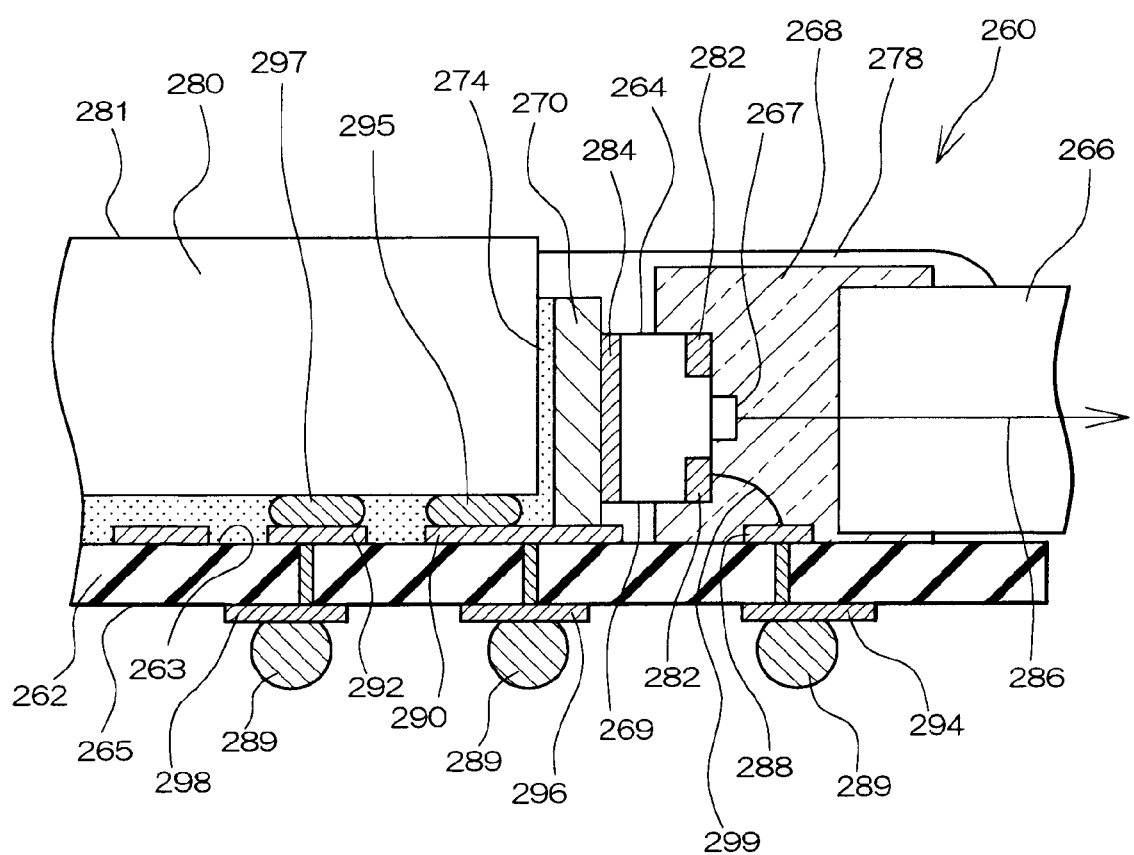
FIG. 14 shows a partial schematic sectional view of a ninth embodiment of the optical module of the present invention.

FIG. 14 is a partial schematic sectional view of a ninth embodiment of the optical module according to the present invention. An optical module 260 adopts a BGA or CSP type mounting configuration. The optical module comprises a plane 263 of a mounting substrate 262 on which a surface emission laser 264, a semiconductor chip 280, and an optical fiber 266 are mounted. Although not shown in the drawing, as in the sixth embodiment, there are three surface emission lasers 264, three semiconductor chips 280, and three optical fibers 266. The surface emission laser 264 is disposed so that a side surface 269 of the semiconductor substrate of the surface emission laser 264 faces the plane 263 of the mounting substrate 262. By this means, the direction of light 286 emitted from a light emitting aperture 267 of the surface emission laser 264 is along the plane 263 of the mounting substrate 262. On the semiconductor chip 280 is formed a CMOS circuit. Drive signals are sent from this CMOS circuit to the surface emission laser 264.

Interconnects 288, 290, and 292 are formed on the plane 263 of the mounting substrate 262. Interconnects 294, 296, and 298 are formed on a back surface 265 of the mounting substrate 262. The back surface 265 is a mounting surface to be mounted on another mounting substrate. The interconnect 288 is electrically connected to the interconnect 294, the interconnect 290 is electrically connected to the interconnect 296, and the interconnect 292 is electrically connected to the interconnect 298. The interconnects 244, 296, and 298 provided with bump electrodes 289.

The surface emission laser 264 is fixed to a positioning plate 270 formed of, for example, copper. The positioning plate 270 functions as an electrode and heat sink. The positioning plate 270 is disposed on the interconnect 290. The positioning plate 270 is adhered to the side surface of the semiconductor chip 280, for example, by silver paste 274.

The positioning plate 270 is disposed so that the surface emission laser 264 is connected to the optical fiber 266. The positioning plate 270 is positioned lower than a semiconductor element formation plane 281 of the semiconductor chip 280. The connecting portion between the surface emission laser 264 and the optical fiber 266 is covered by a transparent resin 268.

The surface emission laser 264 is provided with an upper electrode 282 and a lower electrode 284. The lower electrode 284 contacts the positioning plate 270. The positioning plate 270 is connected to the power supply or ground through the interconnects 290 and 296. The Upper electrode 282 is electrically connected to the interconnects 288 and 294 by a wire 299. Drive signals are transmitted to the upper electrode 282 through the interconnect 294. It should be noted that in place of the wire 299, the upper electrode 282 may be formed to extend to the interconnect 288 as in the eighth embodiment.

Bump electrodes 295 and 297 are formed on the semiconductor chip 280. The bump electrode 295 is electrically connected to the interconnect 290. and the bump electrode 297 is electrically connected to the interconnect 292. A part of the optical fiber 266, the semiconductor chip 280. and the surface emission laser 264 are sealed with a light-blocking resin 278.

(Effect)

The ninth embodiment has the same effect as the sixth embodiment. When the structure that in place of the wire 299, the upper electrode 282 extends as far as the interconnect 288 as in the eighth embodiment is applied, the same effect as the eighth embodiment can be obtained.

It should be noted that in the sixth to ninth embodiments, optical fibers 216 and 266 are used. However, the present invention may equally be applied to an optical waveguide using a glass substrate, plastic film, or the like.

In the sixth to ninth embodiments, surface emission lasers 214 and 264 are used. However, the present invention may equally be applied to a light-emitting element such as a LD or a light-receiving element such as a PD.

It should be noted that in this embodiment, the content of the description in the fourth embodiment can also be applied.

What is claimed is:

1. An optical module comprising:
a mounting member;
an optical element mounted on a plane of the mounting member; and
a semiconductor chip mounted on the plane of the mounting member and electrically connected to the optical element,
wherein the optical element is formed on a semiconductor substrate. emits light in a direction perpendicular to the plane of the semiconductor substrate, and admits light from a direction perpendicular to the plane of the semiconductor substrate;
wherein the optical module further comprises an optical wavelength mounted on the plane of the mounting member and guiding light emitted from the optical element or light admitted to the optical element;
wherein the optical element is mounted so that light emitted from the optical element or light admitted to the optical element travels in a direction along the plane of the mounting member; and
wherein the optical waveguide is mounted along the plane of the mounting member.

2. The optical module as defined in claim 1,
wherein the optical element has an optical aperture from which light is emitted or to which light is admitted; and
wherein the optical aperture is oriented along the plane of the mounting member.

3. The optical module as defined in claim 1,
wherein a positioning member for positioning the optical element is mounted on the plane of the mounting member.

4. The optical module as defined in claim 2,
wherein a positioning member for positioning the optical element is mounted on the plane of the mounting member.

5. The optical module as defined in claim 3,
wherein the positioning member is mounted on a side surface of the semiconductor chip.

6. The optical module as defined in claim 4,
wherein the positioning member is mounted on a side surface of the semiconductor chip.

7. The optical module as defined in claim 5,
wherein the positioning member is positioned lower than a semiconductor element formation plane of the semiconductor chill.

8. The optical module as defined in claim 6,
wherein the positioning member is positioned lower than a semiconductor element formation plane of the semiconductor chip.

9. The optical module as defined in claim 3,
wherein the mounting member includes a first interconnect; and
wherein the positioning member contacts the first interconnect.

10. The optical module as defined in claim 4,
wherein the mounting member includes a first interconnect; and
wherein the positioning member contacts the first interconnect.

11. The optical module as defined in claim 5,
wherein the mounting member includes a first interconnect; and
wherein the positioning member contacts the first interconnect.

12. An optical module comprising:
a mounting member; and
an optical element mounted on a plane of the mounting member.
wherein the optical element is formed on a semiconductor substrate, emits light in a direction perpendicular to the plane of the semiconductor substrate and admits light from a direction perpendicular to the plane of the semiconductor substrate;
wherein the optical module further comprises an optical waveguide mounted on the plane of the mounting member and guiding light emitted from the optical element or light admitted to the optical element;
wherein the optical element is mounted so that light emitted from the optical element or light admitted to the optical element travels in a direction along the plane of the mounting member;
wherein the optical waveguide is mounted along the plane of the mounting member,
wherein the mounting member includes a second interconnect; and
wherein an electrode of the optical element extends to the second interconnect, and is electrically connected to the second interconnect.

13. An optical module comprising:
a mounting member; and
an optical element mounted on a plane of the mounting member,
wherein the optical element is formed on a semiconductor substrate, emits light in a direction perpendicular to the plane of the semiconductor substrate and admits light from a direction perpendicular to the plane of the semiconductor substrate;
wherein the optical module further comprises an optical waveguide mounted on the plane of the mounting member and guiding light emitted from the optical element or light admitted to the optical element;
wherein the optical element is mounted so that light emitted from the optical element or light admitted to the optical element travels in a direction along the plane of the mounting member;
wherein the optical waveguide is mounted along the plane of the mounting member;
wherein the optical element has an optical aperture from which light is emitted or to which light is admitted; and
wherein the optical aperture is oriented along the plane of the mounting member;
wherein the mounting member includes a second interconnect; and wherein an electrode of the optical element extends to the second interconnect, and is electrically connected to the second interconnect.

14. An optical module comprising:

a mounting member; and an optical element mounted on a plane of the mounting member, wherein the optical element is formed on a semiconductor substrate, emits light in a direction perpendicular to the plane of the semiconductor substrate, and admits light from a direction perpendicular to the plane of the semiconductor substrate;

wherein the optical module further comprises an optical waveguide mounted on the plane of the mounting member and guiding light emitted from the optical element or light admitted to the optical element;

wherein the optical element is mounted so that light emitted from the optical element or light admitted to the optical element travels in a direction along the plane of the mounting member;

wherein the optical waveguide is mounted along the plane of the mounting member;

wherein a positioning member for positioning the optical element is mounted on the plane of the mounting member;

wherein the mounting member includes a second interconnect; and wherein an electrode of the optical element extends to the second interconnect, and is electrically connected to the second interconnect.

15. The optical module as defined in claim 1, wherein the optical module is packaged by sealing with a light-blocking resin; and wherein an optical path between the optical element and the optical waveguide is filled with a light-transmitting resin.

16. The optical module as defined in claim 2, wherein the optical module is packaged by sealing with a light-blocking resin; and wherein an optical path between the optical element and the optical waveguide is filled with a light-transmitting resin.

17. The optical module as defined in claim 3, wherein the optical module is packaged by sealing with a light-blocking resin; and wherein an optical path between the optical element and the optical waveguide is filled with a light-transmitting resin.

18. The optical module as defined in claim 3, wherein the positioning member has a function of radiating heat from the optical element.

19. The optical module as defined in claim 4, wherein the positioning member has the function of radiating heat from the optical element.

20. The optical module as defines in claim 5, wherein the positioning member has the function of radiating heat from the optical element.

21. The optical module of claim 1, further comprising a mounting surface to be mounted on another mounting member, wherein the optical waveguide extends in the direction along the mounting surface.

22. A method of manufacturing an optical module, the optical module comprising:

a mounting member;

an optical element mounted on a plane of the mounting member; and a semiconductor chip mounted on the plane of the mounting member and electrically connected to the optical element, wherein the optical element is formed on a semiconductor substrate, emits light in a direction perpendicular to the plane of the semiconductor substrate, and admits light from a direction perpendicular to the plane of the semiconductor substrate;

wherein the optical module further comprises an optical waveguide mounted on the plane of the mounting member and guiding light emitted from the optical element or light admitted to the optical element;

wherein the method comprises:

a step of disposing the optical element so that a side surface of the semiconductor substrate faces a plane of the mounting member;

a step of electrically connecting an upper electrode of the optical element to another electrode; and a step of disposing the optical waveguide in a direction along the plane of the mounting member.

* * * * *